US011785393B2

(12) United States Patent
Lee et al.

(10) Patent No.: US 11,785,393 B2
(45) Date of Patent: Oct. 10, 2023

(54) ELECTRONIC DEVICE INCLUDING SPEAKER MODULE

(71) Applicant: Samsung Electronics Co., Ltd., Suwon-si (KR)

(72) Inventors: Jaehwan Lee, Suwon-si (KR); Hoyeong Lim, Suwon-si (KR); Incheol Baek, Suwon-si (KR); Gihoon Lee, Suwon-si (KR); Yonghwa Kim, Suwon-si (KR); Hyunwoo Sim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 490 days.

(21) Appl. No.: 17/019,643

(22) Filed: Sep. 14, 2020

(65) Prior Publication Data

US 2021/0092528 A1 Mar. 25, 2021

(30) Foreign Application Priority Data

Sep. 24, 2019 (KR) .................. 10-2019-0117692

(51) Int. Cl.
*H04R 17/00* (2006.01)
*H05K 1/14* (2006.01)
(Continued)

(52) U.S. Cl.
CPC ............. *H04R 17/00* (2013.01); *H04R 1/028* (2013.01); *H04R 3/00* (2013.01); *H05K 1/147* (2013.01);
(Continued)

(58) Field of Classification Search
CPC .......... H04R 17/00; H04R 1/028; H04R 3/00; H04R 2400/11; H05K 1/147
(Continued)

(56) References Cited

U.S. PATENT DOCUMENTS 6,658,126 B1    12/2003   Stern
7,418,106 B2     8/2008   Greuet et al.
(Continued)

FOREIGN PATENT DOCUMENTS

CN          104936111 A        9/2015
JP       2012053466 A  *    3/2012    .......... G02B 6/0086
(Continued)

OTHER PUBLICATIONS

International Search Report dated Jan. 12, 2021, issued in International Application No. PCT/KR2020/012369.
(Continued)

*Primary Examiner* — Andargie M Aychillhum
(74) *Attorney, Agent, or Firm* — Jefferson IP Law, LLP

(57) ABSTRACT

An electronic device is provided. The electronic device includes a housing, a display that is visually exposed through one surface of the housing and that includes a display panel including a pixel array and a layer group including a plurality of layers stacked on the display panel, a printed circuit board disposed in the housing, a piezo unit attached to a rear surface of the display panel, and a flexible printed circuit board (FPCB) that is connected to the piezo unit and that extends to the printed circuit board, the flexible printed circuit board including a coil that surrounds at least part of the piezo unit.

20 Claims, 11 Drawing Sheets

(51) Int. Cl.
    *H04R 1/02*     (2006.01)
    *H04R 3/00*     (2006.01)

(52) U.S. Cl.
    CPC ...... *H04R 2400/11* (2013.01); *H04R 2499/11* (2013.01); *H04R 2499/15* (2013.01); *H05K 2201/10083* (2013.01); *H05K 2201/10128* (2013.01)

(58) Field of Classification Search
    USPC .......................................................... 361/749
    See application file for complete search history.

(56) References Cited

U.S. PATENT DOCUMENTS

| | | | |
|---|---|---|---|
| 8,842,860 B2 | 9/2014 | Jang et al. | |
| 8,923,528 B2 | 12/2014 | Arche | |
| 9,736,598 B2 | 8/2017 | Jang et al. | |
| 10,250,961 B2 | 4/2019 | Zhang et al. | |
| 10,694,274 B2 | 6/2020 | Noh et al. | |
| 10,763,572 B2 | 9/2020 | Tsai et al. | |
| 2005/0281425 A1 | 12/2005 | Greuet et al. | |
| 2006/0140438 A1* | 6/2006 | Kimura | H04M 1/03 381/431 |
| 2011/0216929 A1 | 9/2011 | Jang et al. | |
| 2012/0051570 A1 | 3/2012 | Arche | |
| 2015/0010181 A1 | 1/2015 | Jang et al. | |
| 2018/0152773 A1 | 5/2018 | Zhang et al. | |
| 2019/0081389 A1* | 3/2019 | Tsai | H01Q 1/38 |
| 2019/0116405 A1* | 4/2019 | Noh | H04R 1/028 |
| 2020/0169816 A1* | 5/2020 | Kim | G06F 1/1658 |
| 2020/0271626 A1 | 8/2020 | Janfaoui et al. | |
| 2020/0314547 A1* | 10/2020 | Kim | H04R 9/025 |
| 2020/0322707 A1 | 10/2020 | Noh et al. | |
| 2020/0383247 A1 | 12/2020 | Jin et al. | |

FOREIGN PATENT DOCUMENTS

| | | | |
|---|---|---|---|
| KR | 10-0980855 B1 | 9/2010 | |
| KR | 10-2019-0026212 A | 3/2019 | |
| KR | 10-2019-0041563 A | 4/2019 | |
| WO | 2016176997 A1 | 11/2016 | |
| WO | 2019/086815 A1 | 5/2019 | |
| WO | 2019103414 A1 | 5/2019 | |
| WO | WO-2019086815 A1 * | 5/2019 | .......... G01M 5/0033 |

OTHER PUBLICATIONS

Indian Office Action dated Sep. 5, 2022, issued in Indian Application No. 202237020633.
European Search Report dated Sep. 19, 2022, issued in European Application No. 20869241.8.

* cited by examiner

ELECTRONIC DEVICE INCLUDING SPEAKER MODULE

CROSS-REFERENCE TO RELATED APPLICATION(S)

This application is based on and claims priority under 35 U.S.C. § 119(a) of a Korean patent application number 10-2019-0117692, filed on Sep. 24, 2019, in the Korean Intellectual Property Office, the disclosure of which is incorporated by reference herein in its entirety.

BACKGROUND

1. Field

The disclosure relates to an electronic device including a speaker module.

2. Description of Related Art

An electronic device may include one or more speaker modules that convert an electrical signal into a sound. A general speaker module may include an electromagnet that generates a magnetic field and a permanent magnet that is forced in the magnetic field. As the permanent magnet vibrates in the magnetic field, an electrical signal may be converted into a sound.

A piezo speaker module may include a piezo unit that expands and contracts based on an electrical signal. The piezo speaker module may not generate a magnetic field. A vibration plate having the piezo unit attached thereto vibrates to convert an electrical signal into a sound.

The US Federal Communications Commission (FCC) established the Hearing Aid Compatibility (HAC) standards having predetermined performance to enable hearing-impaired persons to use mobile electronic devices. The HAC standards are related to magnetic-field characteristics of speaker modules included in the mobile electronic devices. For example, a permanent magnet included in a hearing aid may vibrate in a magnetic field generated by a speaker module, thereby providing a sound to a hearing-impaired person. Recent electronic devices may include a speaker module that provides a magnetic field that meets the HAC standards.

The above information is presented as background information only to assist with an understanding of the disclosure. No determination has been made, and no assertion is made, as to whether any of the above might be applicable as prior art with regard to the disclosure.

SUMMARY

A piezo unit of a piezo speaker module may be attached to a display panel and may vibrate the display panel. A magnetic field is not generated although an electrical signal is applied to the piezo unit. Therefore, the piezo speaker module cannot meet the Hearing Aid Compatibility (HAC) standards.

Aspects of the disclosure are to address at least the above-mentioned problems and/or disadvantages and to provide at least the advantages described below. Accordingly, an aspect of the disclosure is to provide an electronic device including a coil for generating a magnetic field together with a piezo speaker module to ensure HAC performance.

Additional aspects will be set forth in part in the description which follows and, in part, will be apparent from the description, or may be learned by practice of the presented embodiments.

In accordance with an aspect of the disclosure, an electronic device is provided. The electronic device includes a housing, a display that is visually exposed through one surface of the housing and that includes a display panel including a pixel array and a layer group including a plurality of layers stacked on the display panel, a printed circuit board disposed in the housing, a piezo unit attached to a rear surface of the display panel, and a flexible printed circuit board (FPCB) that is connected to the piezo unit and that extends to the printed circuit board, the flexible printed circuit board including a coil that surrounds at least part of the piezo unit.

In accordance with another aspect of the disclosure, an electronic device is provided. The electronic device includes a first cover that forms a front surface of the electronic device, a second cover opposite to the first cover, a bracket including a frame structure that connects peripheries of the first cover and the second cover and a plate structure that extends from the frame structure to a space between the first cover and the second cover, a display disposed between the plate structure and the first cover so as to be visually exposed through the first cover, a printed circuit board disposed between the plate structure and the second cover, a connecting member extending from the display to the printed circuit board and including a coil formed on a portion thereof, and a speaker module including a piezo unit. The piezo unit is attached to a rear surface of the display and connected with the connecting member, the piezo unit being disposed such that at least part of the piezo unit is surrounded by the coil.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, like reference numerals will be understood to refer to like parts, components, and structures.

DETAILED DESCRIPTION

The following description with reference to accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
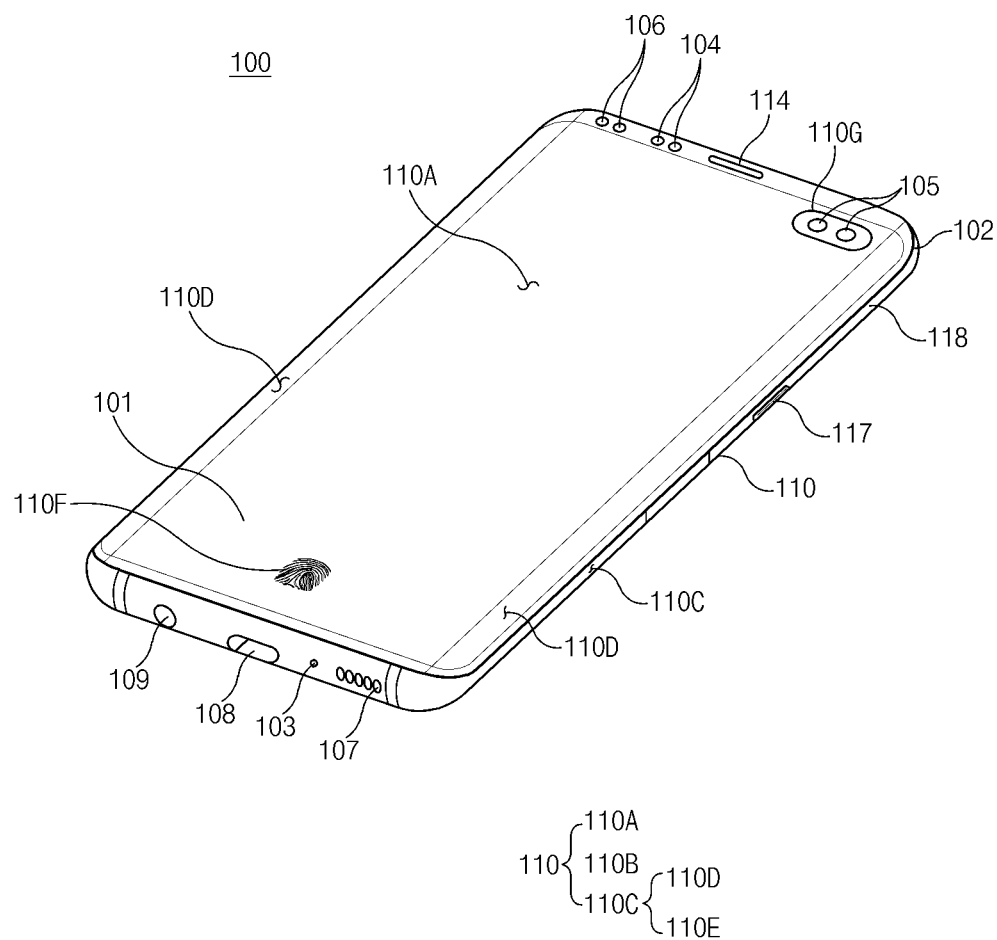
FIG. 1 is a front perspective view of an electronic device according to an embodiment of the disclosure.
Figure 2:
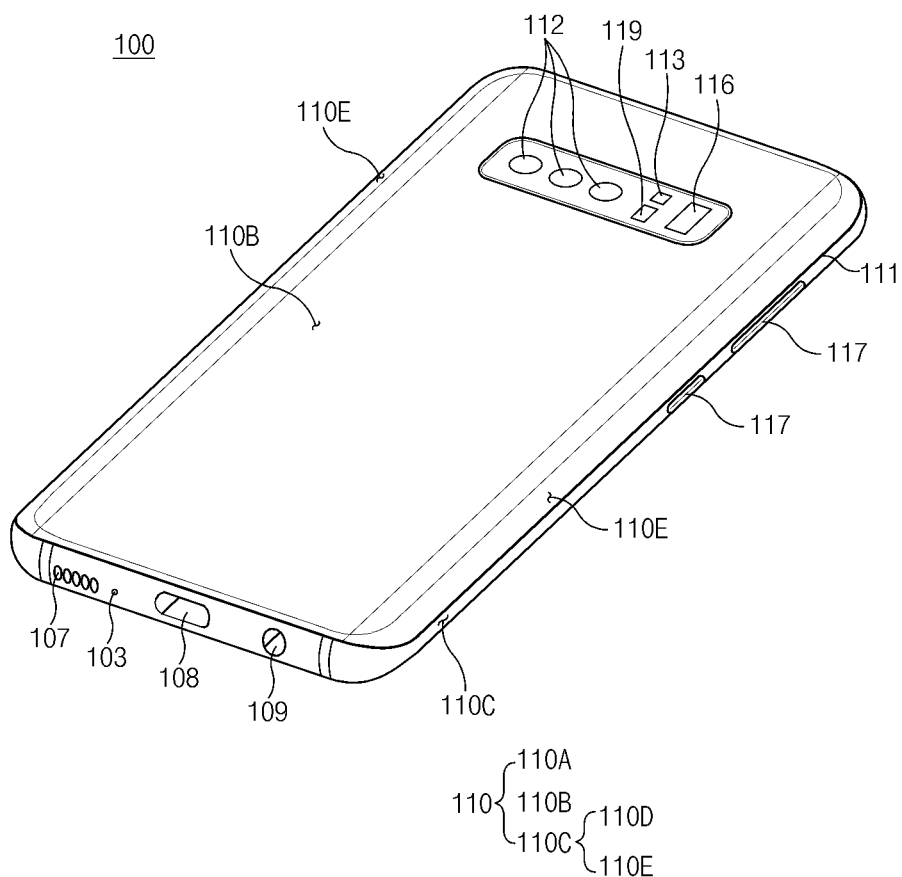
FIG. 2 is a rear perspective view of an electronic device according to an embodiment of the disclosure.

FIG. 1 is a front perspective view of an electronic device according to an embodiment of the disclosure. FIG. 2 is a rear perspective view of an electronic device according to an embodiment of the disclosure.

Referring to FIGS. 1 and 2, the electronic device 100 according to an embodiment may include a housing 110 that includes a first surface (or, a front surface) 110A, a second surface (or, a rear surface) 110B, and side surfaces 110C surrounding a space between the first surface 110A and the second surface 110B.

In another embodiment (not illustrated) of the disclosure, the housing 110 may refer to a structure that forms some of the first surface 110A, the second surface 110B, and the side surfaces 110C of FIG. 1.

According to an embodiment of the disclosure, the first surface 110A may be formed by a front plate 102, at least part of which is substantially transparent (e.g., a glass plate including various coating layers, or a polymer plate). The second surface 110B may be formed by a back plate 111 that is substantially opaque. The back plate 111 may be formed by, for example, coated or colored glass, ceramic, polymer, metal (e.g., aluminum, stainless steel (STS), or magnesium), or a combination of at least two thereof. The side surfaces 110C may be formed by a side bezel structure (or, a "side member") 118 that is coupled with the front plate 102 and the back plate 111 and that contains metal and/or polymer.

In some embodiments of the disclosure, the back plate 111 and the side bezel structure 118 may be integrally formed with each other and may contain the same material (e.g., a metallic material, such as aluminum).

In the illustrated embodiment of the disclosure, the front plate 102 may include, at opposite long edges thereof, two areas A 110D that curvedly and seamlessly extend from the first surface 110A toward the back plate 111.

In the illustrated embodiment (refer to FIG. 2), the back plate 111 may include, at opposite long edges thereof, two areas B 110E that curvedly and seamlessly extend from the second surface 110B toward the front plate 102.

In some embodiments of the disclosure, the front plate 102 (or, the back plate 111) may include only one of the areas A 110D (or, the areas B 110E). In another embodiment of the disclosure, the front plate 102 (or, the back plate 111) may not include a part of the areas A 110D (or, the areas B 110E).

In the above-described embodiments of the disclosure, when viewed from a side of the electronic device 100, the side bezel structure 118 may have a first thickness (or width) at sides (e.g., short sides) not including the areas A 110D or the areas B 110E and may have a second thickness at sides (e.g., long sides) including the areas A 110D or the areas B 110E, the second thickness being smaller than the first thickness.

According to an embodiment of the disclosure, the electronic device 100 may include at least one of a display 101, audio modules 103, 107, and 114, sensor modules 104, 116, and 119, camera modules 105, 112, and 113, key input devices 117, light emitting elements 106, and connector holes 108 and 109. In some embodiments of the disclosure, the electronic device 100 may not include at least one component (e.g., the key input devices 117 or the light emitting elements 106) among the aforementioned components, or may further include other component(s).

The display 101 may be exposed through, for example, a large portion of the front plate 102. In some embodiments of the disclosure, at least part of the display 101 may be exposed through the front plate 102 that includes the first surface 110A and the areas A 110D of the side surfaces 110C.

In some embodiments of the disclosure, the periphery of the display 101 may be formed to be substantially the same as the shape of the adjacent outside edge of the front plate 102. In another embodiment (not illustrated) of the disclosure, to expand the area by which the display 101 is exposed, the gap between the periphery of the display 101 and the periphery of the front plate 102 may be formed to be substantially constant.

In an embodiment of the disclosure, a surface of the housing 110 (or, the front plate 102) may include a screen display area that is formed as the display 101 is visually exposed. For example, the screen display area may include the first surface 110A and the areas A 110D of the side surfaces 110C.

In the illustrated embodiment of the disclosure, the screen display area 110A and 110D may include a sensing area 110F configured to obtain biometric information of a user. Here, when the screen display area 110A and 110D includes the sensing area 110F, this may mean that at least part of the sensing area 110F overlaps the screen display area 110A and 110D. In other words, the sensing area 110F may refer to an area capable of displaying visual information by the display 101 similarly to the other areas of the screen display area 110A and 110D and additionally obtaining the user's biometric information (e.g., fingerprint).

In the illustrated embodiment of the disclosure, the screen display area 110A and 110D of the display 101 may include an area 110G through which the first camera device 105

(e.g., a punch hole camera) is visually exposed. At least part of the periphery of the area 110G, through which the first camera device 105 is exposed, may be surrounded by the screen display area 110A and 110D. In various embodiments of the disclosure, the first camera device 105 may include a plurality of camera devices.

In another embodiment (not illustrated) of the disclosure, the screen display area 110A and 110D of the display 101 may have recesses or openings formed therein, and the electronic device 100 may include at least one of the audio module 114, the first sensor module 104, and the light emitting elements 106 that are aligned with the recesses or the openings.

In another embodiment (not illustrated) of the disclosure, the display 101 may include, on a rear surface of the screen display area 110A and 110D, at least one of the audio module 114, the sensor modules 104, 116, and 119, and the light emitting elements 106.

In another embodiment (not illustrated) of the disclosure, the display 101 may be coupled with, or disposed adjacent to, touch detection circuitry, a pressure sensor for measuring the intensity (pressure) of a touch, and/or a digitizer for detecting a stylus pen of a magnetic type.

In some embodiments of the disclosure, at least some of the sensor modules 104, 116, and 119 and/or at least some of the key input devices 117 may be disposed on the side surfaces 110C (e.g., the areas A 110D and/or the areas B 110E).

The audio modules 103, 107, and 114 may include the microphone hole 103 and the speaker holes 107 and 114. A microphone for obtaining a sound from the outside may be disposed in the microphone hole 103, and in some embodiments of the disclosure, a plurality of microphones may be disposed in the microphone hole 103 to detect the direction of a sound. The speaker holes 107 and 114 may include the external speaker hole 107 and the receiver hole 114 for a telephone call. In some embodiments of the disclosure, the speaker holes 107 and 114 and the microphone hole 103 may be implemented with one hole, or a speaker (e.g., a piezo speaker) may be included without the speaker holes 107 and 114.

The sensor modules 104, 116, and 119 may generate an electrical signal or a data value that corresponds to an operational state inside the electronic device 100 or an environmental state external to the electronic device 100. For example, the sensor modules 104, 116, and 119 may include the first sensor module 104 (e.g., a proximity sensor) that is disposed on the first surface 110A of the housing 110, the second sensor module 116 (e.g., a TOF camera device) that is disposed on the second surface 110B of the housing 110, the third sensor module 119 (e.g., an HRM sensor) that is disposed on the second surface 110B of the housing 110, and/or the fourth sensor module (e.g., a sensor 190 of FIG. 3) (e.g., a fingerprint sensor) that is coupled to the display 101.

In various embodiments of the disclosure, the second sensor module 116 may include a TOF camera device for measuring a distance.

In various embodiments of the disclosure, at least part of the fourth sensor module (e.g., the sensor 190 of FIG. 3) may be disposed under the screen display area 110A and 110D. For example, the fourth sensor module may be disposed in a recess (e.g., a recess 139 of FIG. 3) that is formed on a rear surface of the display 101. For example, the fourth sensor module (e.g., the sensor 190 of FIG. 3) may not be exposed through the screen display area 110A and 110D and may form the sensing area 110F in at least part of the screen display area 110A and 110D.

In some embodiments (not illustrated) of the disclosure, the fingerprint sensor may be disposed on the second surface 110B as well as the first surface 110A of the housing 110 (e.g., the screen display area 110A and 110D).

In various embodiments of the disclosure, the electronic device 100 may further include a non-illustrated sensor module, which may be, for example, at least one of a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or an illuminance sensor.

The camera modules 105, 112, and 113 may include the first camera device 105 (e.g., a punch hole camera device) exposed through the first surface 110A of the electronic device 100, and the second camera device 112 and/or the flash 113 exposed through the second surface 110B of the electronic device 100.

In the illustrated embodiment of the disclosure, the first camera device 105 may be exposed through part of the screen display area 110D of the first surface 110A. For example, the first camera device 105 may be exposed on a partial area of the screen display area 110D through an opening (not illustrated) that is formed in part of the display 101.

In the illustrated embodiment of the disclosure, the second camera device 112 may include a plurality of camera devices (e.g., a dual camera or a triple camera). However, the second camera device 112 is not necessarily limited to including the plurality of camera devices and may include one camera device.

The camera devices 105 and 112 may include one or more lenses, an image sensor, and/or an image signal processor. The flash 113 may include, for example, a light emitting diode or a xenon lamp. In some embodiments of the disclosure, two or more lenses (an IR camera lens, a wide angle lens, and a telephoto lens) and image sensors may be disposed on one surface of the electronic device 100.

The key input devices 117 may be disposed on the side surfaces 110C of the housing 110. In another embodiment of the disclosure, the electronic device 100 may not include all or some of the aforementioned key input devices 117, and the key input devices 117 not included may be implemented in a different form, such as a soft key on the display 101. In some embodiments of the disclosure, the key input devices may include a sensor module (e.g., the sensor 190 of FIG. 3) that forms the sensing area 110F included in the screen display area 110A and 110D.

The light emitting elements 106 may be disposed on, for example, the first surface 110A of the housing 110. For example, the light emitting elements 106 may provide state information of the electronic device 100 in the form of light. In another embodiment of the disclosure, the light emitting elements 106 may provide, for example, a light source that operates in conjunction with the first camera device 105. The light emitting elements 106 may include, for example, an LED, an IR LED, and a xenon lamp.

The connector holes 108 and 109 may include the first connector hole 108 for accommodating a connector (e.g., a USB connector) for transmitting and receiving power and/or data with an external electronic device, and/or the second connector hole 109 (e.g., an earphone jack) for accommodating a connector for transmitting and receiving audio signals with an external electronic device.

Figure 3:
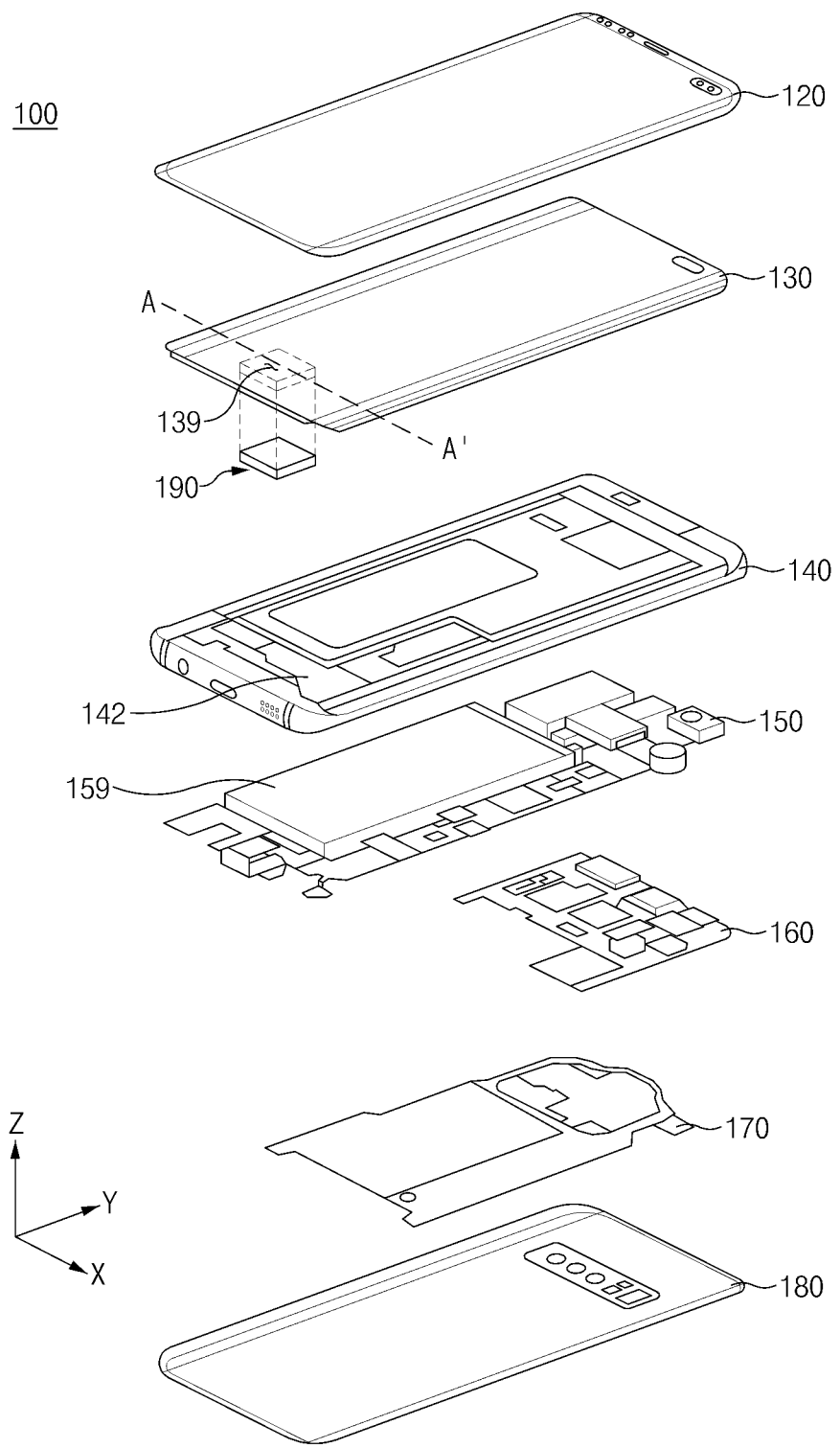
FIG. 3 is an exploded perspective view of an electronic device according to an embodiment of the disclosure.

FIG. 3 is an exploded perspective view of an electronic device according to an embodiment of the disclosure.

Referring to FIG. 3, the electronic device 100 may include a first cover 120 (e.g., the front surface 110A and the areas A 110D of FIG. 1), a display 130 (e.g., the display 101 of FIG. 1), a side member 140 (e.g., a part of the side surfaces 110C of FIG. 1), a first support member 142 (e.g., a bracket), a printed circuit board 150, a battery 159, a rear case 160, an antenna 170, and a second cover 180 (e.g., the rear surface 110B and the areas B 110E of FIG. 1). In some embodiments of the disclosure, the electronic device 100 may not include at least one component (e.g., the first support member 142 or the rear case 160) among the aforementioned components, or may further include other component(s). At least one of the components of the electronic device 100 may be the same as, or similar to, at least one of the components of the electronic device 100 of FIG. 1 or FIG. 2, and repetitive descriptions will hereinafter be omitted.

According to various embodiments of the disclosure, the first cover 120 may be a window of the display 130 (e.g., a glass plate including various coating layers, or a polymer plate).

The first support member 142 may be disposed in the electronic device 100 and may be connected with the side member 140, or the first support member 142 may be integrally formed with the side member 140. The first support member 142 may be formed of, for example, a metallic material and/or a nonmetallic (e.g., polymer) material. The display 130 may be coupled to one surface of the first support member 142, and the printed circuit board 150 may be coupled to an opposite surface of the first support member 142. A processor, a memory, and/or an interface may be mounted on the printed circuit board 150. The processor may include, for example, one or more of a central processing unit, an application processor, a graphic processing unit, an image signal processor, a sensor hub processor, or a communication processor.

The memory may include, for example, a volatile memory or a nonvolatile memory.

The interface may include, for example, a high definition multimedia interface (HDMI), a universal serial bus (USB) interface, a secure digital (SD) card interface, and/or an audio interface. For example, the interface may electrically or physically connect the electronic device 100 with an external electronic device and may include a USB connector, an SD card/multimedia card (MMC) connector, or an audio connector.

The battery 159, which is a device for supplying power to at least one component of the electronic device 100, may include, for example, a primary cell that is not rechargeable, a secondary cell that is rechargeable, or a fuel cell. At least part of the battery 159 may be disposed on, for example, substantially the same plane as the printed circuit board 150. The battery 159 may be integrally disposed inside the electronic device 100, or may be disposed so as to be detachable from the electronic device 100.

The antenna 170 may be disposed between the second cover 180 and the battery 159. The antenna 170 may include, for example, a near field communication (NFC) antenna, a wireless charging antenna, and/or a magnetic secure transmission (MST) antenna. For example, the antenna 170 may perform short range communication with an external device, or may wirelessly transmit and receive power required for charging. In another embodiment of the disclosure, an antenna structure may be formed by the side member 140 and/or part of the first support member 142, or a combination thereof.

Figure 4A:
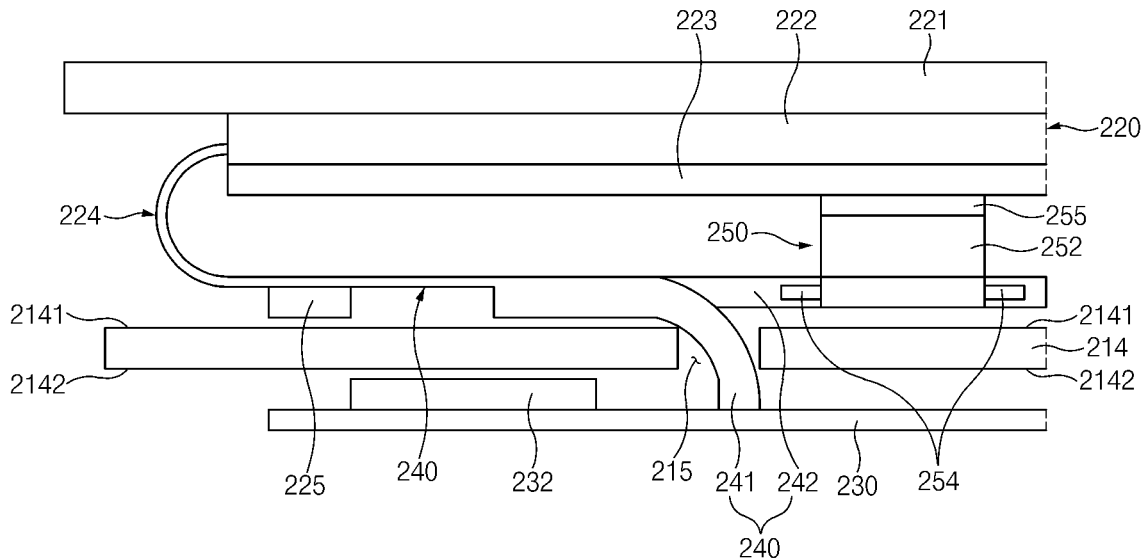
FIGS. 4A and 4B are views illustrating an inside of an electronic device according to various embodiments of the disclosure.
Figure 4B:
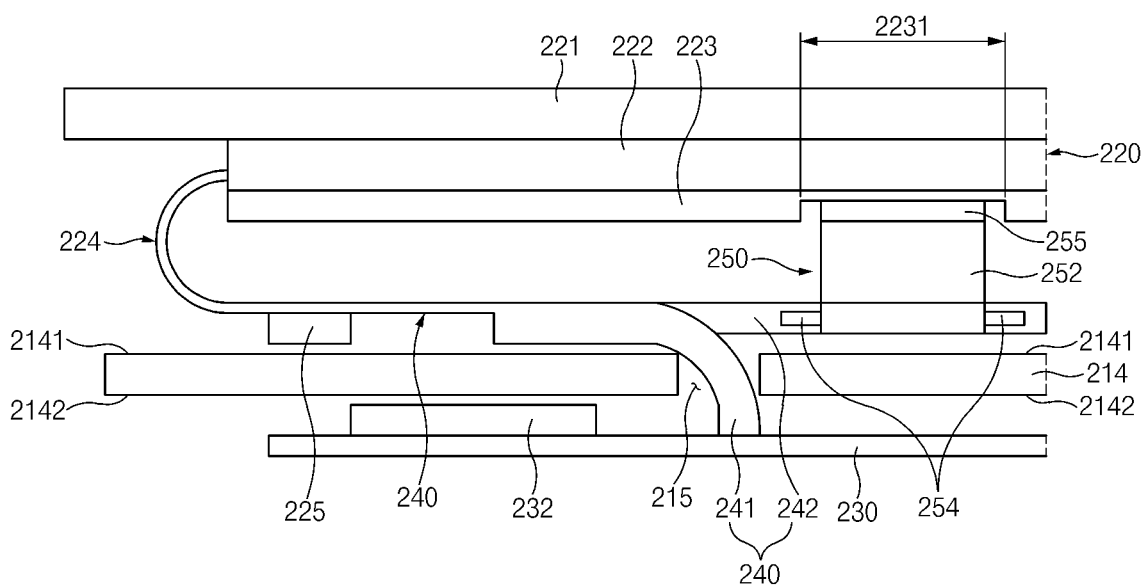

FIGS. 4A and 4B are views illustrating an inside of an electronic device according to various embodiments of the disclosure.

Referring to FIGS. 4A and 4B, in the illustrated embodiment of the disclosure, the electronic device 200 may include a housing 210 (e.g., the housing 110 of FIG. 1), a display 220 (e.g., the display 130 of FIG. 3), a printed circuit board 230 (e.g., the printed circuit board 150 of FIG. 3), a connecting member 240, and a speaker module 250.

In the illustrated embodiment of the disclosure, the housing 210 may include a plate structure 214 (e.g., the side member 140 of FIG. 3) that includes a first surface 2141 facing the display 220 and a second surface 2142 facing the printed circuit board 230. The first surface 2141 and the second surface 2142 may be opposite to each other. The housing 210 may contain the display 220, the printed circuit board 230, the connecting member 240 extending to the display 220 and the printed circuit board 230, and the speaker module 250. The plate structure 214 may have an opening 215 into which part of the connecting member 240 extends. In various embodiments of the disclosure, the housing 210 is not limited to including the plate structure 214 and may include a housing having a different form.

In the illustrated embodiment of the disclosure, the display 220 may include a glass cover 221 that forms a surface of the housing 210 (e.g., the front surface 110A and a part of the side surfaces 110C of FIG. 1), a layer group 223 that faces the first surface 2141 of the plate structure 214 and that includes a plurality of layers, and a display panel 222 disposed between the layer group 223 and the glass cover 221. In some embodiments of the disclosure, the electronic device 200 may include a housing from which the plate structure 214 is omitted. In this case, the layer group 223 may face the printed circuit board 230. In some embodiments of the disclosure, the glass cover 221 may be implemented as a component or part of the housing 210.

In the illustrated embodiment of the disclosure, at least part (e.g., a piezo unit 252) of the speaker module 250 may be disposed on the layer group 223 of the display 220. The piezo unit 252 included in the speaker module 250 may be attached to the layer group 223 of the display 220. The display 220 may be coupled in various structures so as to vibrate together when the piezo unit 252 vibrates. For example, referring to FIG. 4A, the piezo unit 252 may be attached to a lower surface of the layer group 223. In another example, referring to FIG. 4B, the layer group 223 may include an opening area 2231 formed on the lower surface thereof. The opening area 2231 may be formed through at least some of the layers included in the layer group 223. The piezo unit 252 may be disposed in the opening area 2331 formed on the layer group 223. In various embodiments of the disclosure, the display panel 222 may include a pixel array including a plurality of light emitting elements, a thin film transistor layer, a thin film encapsulation layer that encapsulates the pixel array, a polarizer, and a touch sensor array.

In various embodiments of the disclosure, the layer group 223 may include at least one of a light blocking layer (e.g., a black layer including an uneven pattern) for blocking light generated from the display panel 222 or light incident from the outside, a cushion layer for alleviating external shock, and a shielding layer for blocking noise generated from the display 220 or the printed circuit board 230. The cushion layer may include, for example, an EMBO layer having an embossing pattern formed thereon. The shielding layer may include, for example, a metal layer containing copper (Cu), or a graphite layer. In various embodiments of the disclosure, the layer group 223 may include at least some of the layers.

In the illustrated embodiment of the disclosure, the printed circuit board 230 may be disposed on the second surface 2142 of the plate structure 214. The printed circuit board 230 may include a processor 232. The printed circuit board 230 may be connected to the display 220 through the connecting member 240. The processor 232 included in the printed circuit board 230 may be electrically connected with a display driver integrated circuit (IC) 225 through wiring included in the connecting member 240.

In the illustrated embodiment of the disclosure, the connecting member 240 may extend from the display 220 to the printed circuit board 230. The connecting member 240 may extend from the display panel 222, may pass through the opening 215 formed in the plate structure 214, and may extend to the printed circuit board 230. The connecting member 240 may include the display driver IC 225.

In various embodiments of the disclosure, the connecting member 240 may include a flexible printed circuit board (FPCB). The display driver IC 225 may be mounted on the flexible printed circuit board as a separate module, or may be printed on the flexible printed circuit board.

In some embodiments of the disclosure, the display 220 may further include an extension layer 224 extending from the display panel 222. The connecting member 240 may be connected to the extension layer 224. The display driver IC 225 may be disposed on the extension layer 224.

In the illustrated embodiment of the disclosure, the connecting member 240 may include a first area 241 that extends to the printed circuit board 230 and a second area 242 that branches off from the first area 241 and that is connected to the piezo unit 252. The first area 241 may be connected to the printed circuit board 230, which is disposed on the second surface 2142 of the plate structure 214, through the inside of the opening 215 formed in the plate structure 214. The second area 242 may extend to between the first surface 2141 of the plate structure 214 and the display 220, and the piezo unit 252 may be disposed on at least part of the second area 242.

In various embodiments of the disclosure, the connecting member 240 may include a coil 254 formed in at least a partial area thereof. The coil 254 may be formed in the second area 242 of the connecting member 240. The coil 254 may be formed to surround at least part of the piezo unit 252. The coil 254 may be electrically connected with the processor 232, which is disposed on the printed circuit board 230, through the first area 241 of the connecting member 240. The coil 254 may generate a magnetic field based on an electrical signal received from the processor 232. The magnetic field may vibrate a permanent magnet and a vibration plate included in a hearing aid device (e.g., a hearing aid), thereby providing a sound to a hearing aid wearer.

In the illustrated embodiment of the disclosure, the speaker module 250 may include the piezo unit 252 connected to the connecting member 240. The piezo unit 252 may be connected to the area of the connecting member 240 in which the coil 254 is formed. The speaker module 250 may be disposed such that at least part of the piezo unit 252 is surrounded by the coil 254. The piezo unit 252 may generate sound waves by vibrating the display 220 based on an electrical signal received from the processor 232. The piezo unit 252 may convert the electric signal into a sound.

In various embodiments of the disclosure, the piezo unit 252 may be attached to the layer group 223 of the display 220. An adhesive member 255 may be disposed between the piezo unit 252 and the layer group 223 of the display 220. The adhesive member 255 may include an adhesive layer containing an adhesive material. For example, the adhesive material may include an ultraviolet (UV) curable resin or a thermosetting resin. The piezo unit 252 may be connected with the second area 242 of the connecting member 240. The coil 254 may be formed around the piezo unit 252.

In various embodiments of the disclosure, the piezo unit 252 may be attached to part of the layer group 223.

In various embodiments of the disclosure, the piezo unit 252 may be attached to a layer that forms a rear surface (e.g., a lower surface) of the display 220, among the layers in the layer group 223. For example, in a case where the shielding layer is disposed in the lowermost position, the piezo unit 252 may be attached to the shielding layer.

In various embodiments of the disclosure, the layer group 223 may have an opening formed through the layer group 223, and the piezo unit 252 may be disposed in the opening. In this case, the piezo unit 252 may be attached to a rear surface of the display panel 222.

In various embodiments of the disclosure, the layer group 223 may have an opening formed through some of the layers in the layer group 223, and the piezo unit 252 may be disposed in the opening. In this case, the piezo unit 252 may be attached to a layer exposed on the rear surface of the display 220 by the opening, among the layers in the layer group 223.

In some embodiments of the disclosure, an electronic device 200 may include a housing including a plate structure 214, a display 220 exposed through one surface of the housing, a printed circuit board 230 disposed in the housing, a piezo unit 252 attached to a layer group 223 of the display 220, and a flexible printed circuit board (e.g., a second flexible printed circuit board 342 of FIG. 9B) that includes a coil 254. One side of the flexible printed circuit board may be connected to the printed circuit board 230, and an opposite side of the flexible printed circuit board may be connected to the piezo unit 252. The coil 254 may be formed by a conductive pattern of the flexible printed circuit board.

The piezo unit 252 may be attached to the layer group 223 of the display 220, may be connected to the flexible printed circuit board, and may be disposed such that at least part of the piezo unit 252 is surrounded by the coil 254.

The flexible printed circuit board may be a partial area of a connecting member 240. For example, the flexible printed circuit board may be included in a second area 242 of the connecting member 240.

The flexible printed circuit board may extend to the printed circuit board 230 through an opening formed in the plate structure 214. The opening may be an opening (e.g., the opening 215 of FIGS. 4A and 4B) through which a first area 241 of the connecting member 240 passes, or may be another opening (e.g., a second opening 3152 of FIG. 9B).

Figure 5:
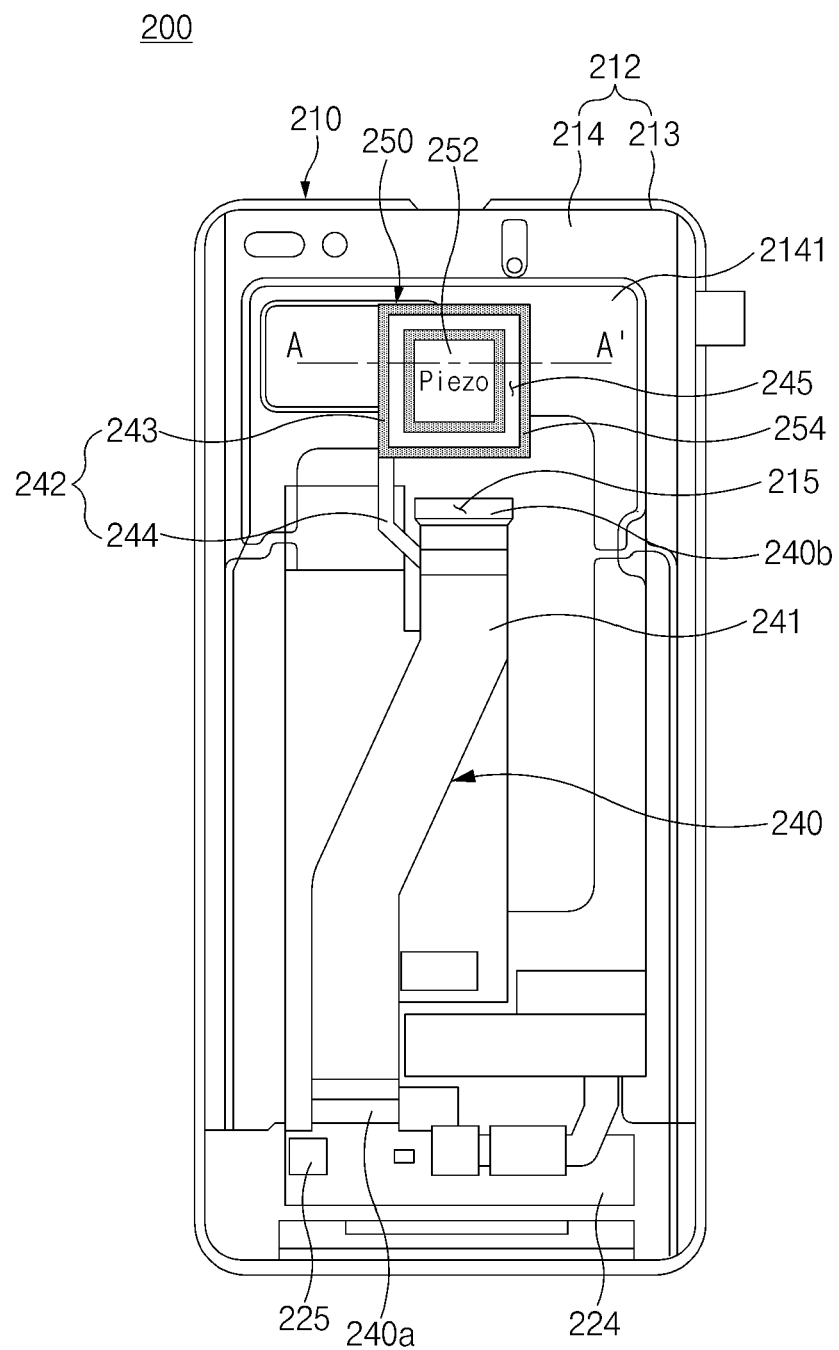
FIG. 5 is a view illustrating a speaker module of an electronic device according to an embodiment of the disclosure.

FIG. 5 is a view illustrating a speaker module of an electronic device according to an embodiment of the disclosure. FIG. 5 is a view in which the first cover and the display are omitted from the electronic device illustrated in FIGS. 4A and 4B.

Referring to FIG. 5, the housing 210 may include a bracket 212 that includes a frame structure 213 that forms surfaces (e.g., side surfaces) of the electronic device 200 and the plate structure 214 that extends from the frame structure 213 to the interior space of the housing 210.

In the illustrated embodiment of the disclosure, a first end portion 240a of the connecting member 240 may be connected with the extension layer 224, and a second end portion 240b of the connecting member 240 may be connected with the printed circuit board 230. The connecting member 240 may include the first area 241 extending from the extension layer 224 of the display 220 to the printed circuit board 230 through the opening 215 and the second area 242 extending from the first area 241. The second area 242 may extend from any area between the first end portion 240a and the second end portion 240b.

In various embodiments of the disclosure, the connecting member 240 may include the coil 254 formed in at least a partial area thereof. The coil 254 may be formed in the second area 242 of the connecting member 240. The coil 254 may be formed to surround at least part of the piezo unit 252. The coil 254 may be electrically connected with the processor 232, which is disposed on the printed circuit board 230, through the first area 241 of the connecting member 240.

In various embodiments of the disclosure, the coil 254 may generate a magnetic field based on an electrical signal transmitted from the processor 232. The magnetic field generated by the coil 254 may generate a sound by vibrating a permanent magnet and a vibration plate connected to the permanent magnet. In this case, the permanent magnet and the vibration plate that interact with the magnetic field may be included in a hearing aid device (e.g., a hearing aid).

In some embodiments of the disclosure, the permanent magnet and the vibration plate that interact with the magnetic field generated by the coil 254 may be disposed in the electronic device 200. In this case, the coil 254, the permanent magnet, and the vibration plate may be referred to as a dynamic speaker module.

In the illustrated embodiment of the disclosure, the second area 242 may include a coil area 243 in which the coil 254 is formed and a line area 244 extending from the coil area 243 to the first area 241. The coil area 243 may include a wire that forms the coil 254 and a board for arrangement of the wire. The line area 244 may include wires through which electrical signals are transmitted to the coil 254 and the piezo unit 252.

In various embodiments of the disclosure, the coil area 243 may further include an opening 245 formed in an area surrounded by the coil 254. In various embodiments of the disclosure, the opening 245 may be formed to be partially aligned with the piezo unit 252. In various embodiments of the disclosure, the opening 245 may be formed to have a substantially larger area than the piezo unit 252. The piezo unit 252 may be disposed in the opening 245. The coil 254 may be formed around the opening 245 to surround the piezo unit 252.

In the illustrated embodiment of the disclosure, the speaker module 250 may include the piezo unit 252 connected to the connecting member 240. The piezo unit 252 may be connected to the coil area 243 of the connecting member 240. The speaker module 250 may be disposed such that at least part of the piezo unit 252 is surrounded by the coil 254.

In various embodiments of the disclosure, the piezo unit 252 may vibrate as an electrical signal is transmitted from the processor 232. The piezo unit 252 may be attached to the rear surface of the display 220. For example, the piezo unit 252 may be attached to the rear surface of the display 220 by an adhesive material. The adhesive material may include, for example, a UV curable resin or a thermosetting resin. The piezo unit 252 may vibrate the display 220 together based on an electrical signal to convert the electrical signal into a sound.

Figure 6A:
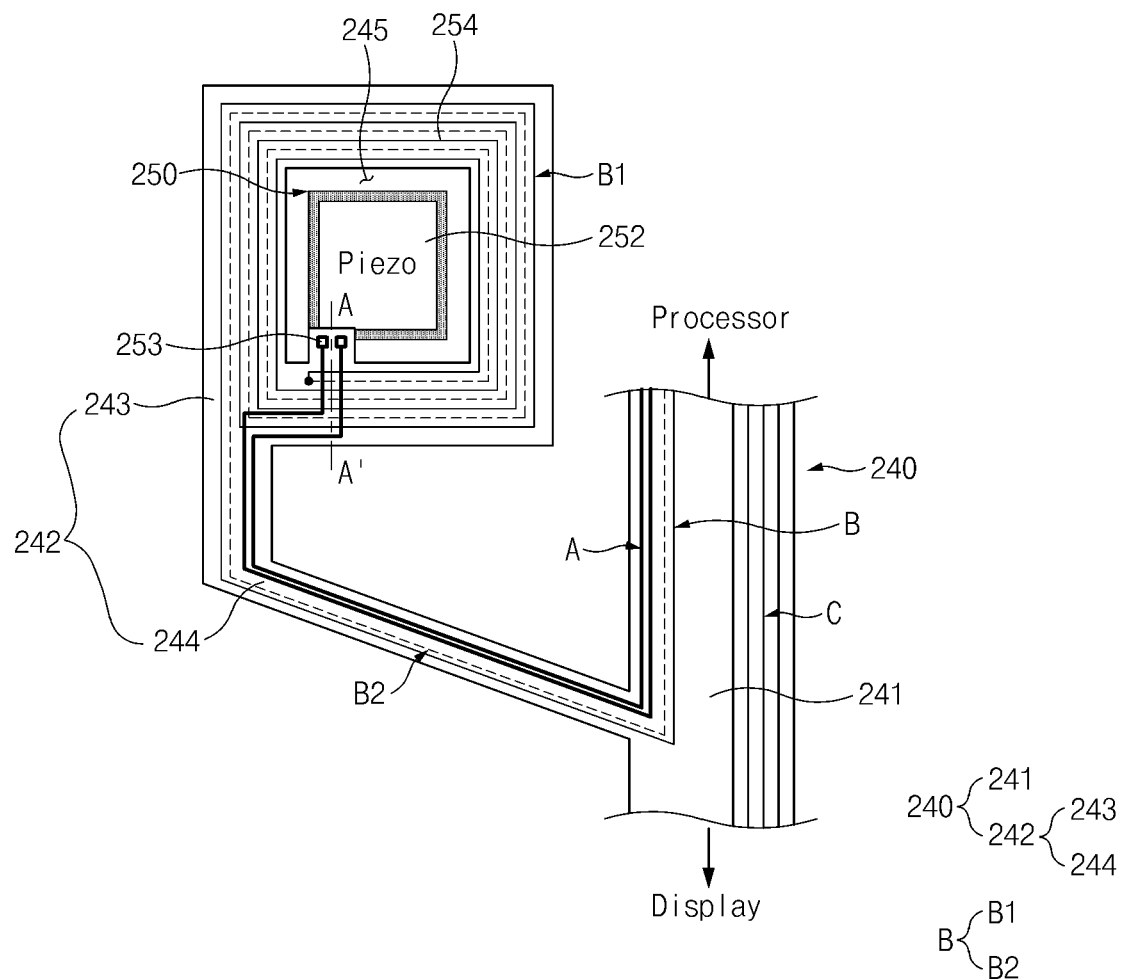
FIGS. 6A and 6B are views illustrating a connecting member and a speaker module of an electronic device according to various embodiments of the disclosure.
Figure 6B:
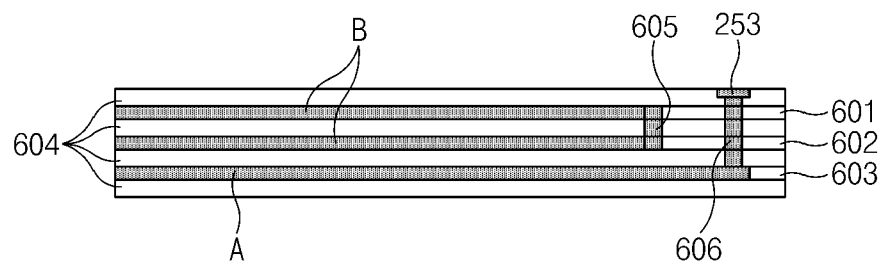

FIGS. 6A and 6B are views illustrating a connecting member and a speaker module of an electronic device according to various embodiments of the disclosure.

Referring to FIG. 6A, the speaker module 250 may include the piezo unit 252 disposed in the second area 242 or at least partially aligned with the opening 245 formed in the second area 242.

In the illustrated embodiment of the disclosure, the connecting member 240 may include the first area 241 connecting the display 220 and the processor 232, the second area 242 extending from the first area 241 to the piezo unit 252, and the coil 254 formed in the second area 242. The second area 242 may include the coil area 243 in which the coil 254 is formed and that is connected with the piezo unit 252 and the line area 244 that connects the coil area 243 and the first area 241.

In the illustrated embodiment of the disclosure, the connecting member 240 may include a plurality of wires A, B, and C. The plurality of wires A, B, and C may include the first wire A that electrically connects the processor 232 and the piezo unit 252, the second wire B that forms the coil 254 and that electrically connects the processor 232 and the coil 254, and the third wire C that electrically connects the processor 232 and the display 220. Each of the wires A, B, and C may include a plurality of wires.

In various embodiments of the disclosure, the first wire A may extend from a terminal 253 of the piezo unit 252 to the first area 241 via the coil area 243 and the line area 244. The first wire A may be formed such that at least part thereof is across the second wire B. The first wire A may electrically connect the piezo unit 252 and the processor 232.

In various embodiments of the disclosure, the second wire B may include a coil portion B1 that forms the coil 254 and a line portion B2 that extends from the coil portion B1 to the processor 232. The line portion B2 may extend from the coil area 243 to the first area 241 via the line area 244. The line portion B2 may electrically connect the coil 254 and the processor 232.

In various embodiments of the disclosure, the third wire C may be formed in the first area 241. The third wire C may electrically connect the display 220 and the processor 232.

Referring to FIG. 6B, in various embodiments of the disclosure, the connecting member 240 may include a flexible printed circuit board (FPCB) that includes a plurality of conductive layers 601, 602, and 603. The first wire A, the second wire B, and the third wire C may be conductive patterns included in the flexible printed circuit board. The first wire A, the second wire B, and the third wire C may each be a conductive pattern formed on a part of the plurality of conductive layers 601, 602, and 603. Two or more wires (e.g., at least two of the first wire A, the second wire B, and the third wire C) may be formed on one conductive layer.

In the illustrated embodiment of the disclosure, at least part of the first wire A, which extends from the terminal 253 of the piezo unit 252, may intersect with the coil portion B1 of the second wire B.

In various embodiments of the disclosure, the second area 242 may include the conductive layers 601, 602, and 603 and insulating layers 604 disposed between the conductive layers 601, 602, and 603. The second wire B may be formed on the first conductive layer 601 and the second conductive layer 602. Part of the second wire B may be formed on the first conductive layer 601, and the remaining part may be formed on the second conductive layer 602. The second wire B formed on the first conductive layer 601 and the second wire B formed on the second conductive layer 602 may be electrically connected through a first VIA 605. The first wire A may be formed on the third conductive layer 603. The first wire A formed on the third conductive layer 603 may be electrically connected with the terminal 253 of the piezo unit 252 through a second VIA 606. However, the wires A, B, and C and the conductive layers 601, 602, and 603 on which the wires A, B, and C are formed are not limited to those illustrated in the drawing. For example, the plurality of wires A, B, and C may be formed on one conductive layer.

The coil 254 in the embodiments of the disclosure is not necessarily limited to being formed in part (e.g., the second area 242 or the coil area 243) of the connecting member 240. For example, the electronic device 200 may further include a separate flexible printed circuit board (e.g., the second flexible printed circuit board 342 of FIG. 9B) that is different from the connecting member 240. In this case, the flexible printed circuit board may include the coil 254 that is connected with the piezo unit 252 and that surrounds at least part of the piezo unit 252. The flexible printed circuit board may extend from the piezo unit 252 to the printed circuit board 230. The flexible printed circuit board may include the first wire A that electrically connects the processor 232 and the piezo unit 252 and the second wire B that forms the coil 254 and that electrically connects the processor 232 and the coil 254.

Figure 7A:
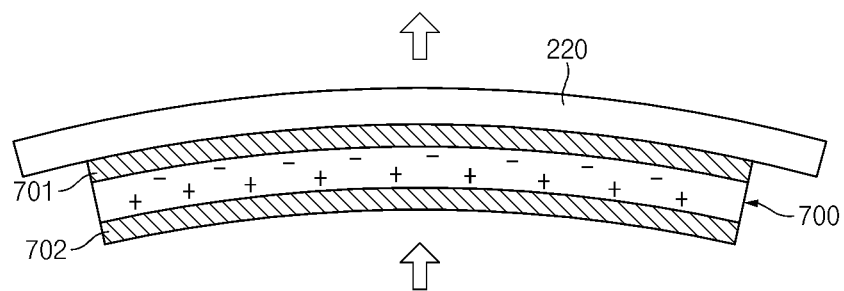
FIGS. 7A, 7B, and 7C are views illustrating operation of a piezo unit and a coil of a speaker module of an electronic device according to various embodiments of the disclosure.
Figure 7B:
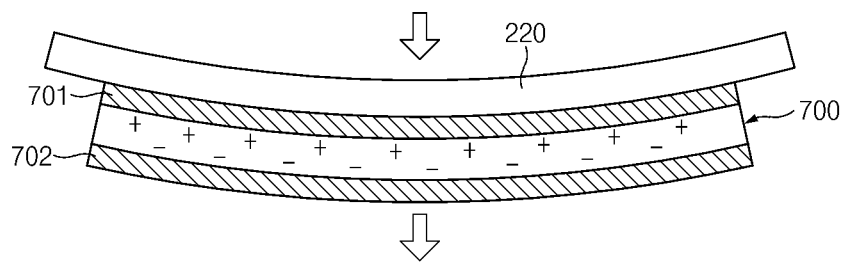
Figure 7C:
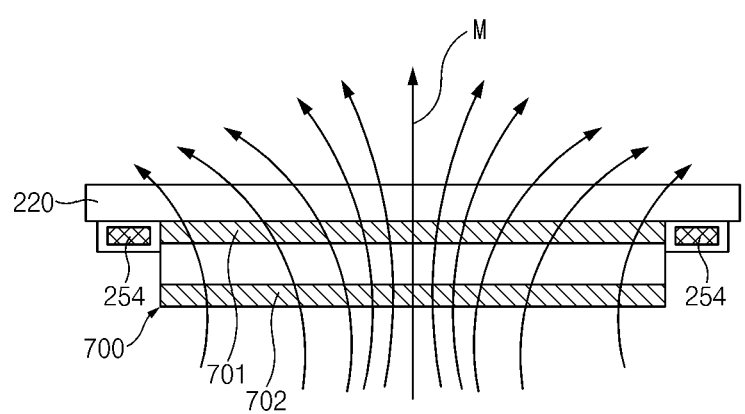

FIGS. 7A, 7B, and 7C are views illustrating operation of a piezo unit and a coil of an electronic device according to various embodiments of the disclosure.

Referring to FIGS. 7A, 7B, and 7C, in the illustrated embodiment of the disclosure, the piezo unit 700 may be attached to the rear surface of the display 220. The piezo unit 700 may include a first layer 701, a second layer 702 spaced apart downward from the first layer 701, and a dielectric substance disposed between the first layer 701 and the second layer 702. The first layer 701 and the second layer 702 may contain a ceramic material (e.g., piezoelectric ceramic). Opposite voltages may be applied to the first layer 701 and the second layer 702, respectively. When the voltages are applied to the layers 701 and 702 of the piezo unit 700, the layers 701 and 702 may vibrate while expanding and contracting. At this time, the display 220 having the piezo unit 700 attached thereto may vibrate together. For example, the display 220 may function as a vibration plate, and the vibration of the display 220 may generate sound waves.

For example, referring to FIG. 7A, in a case where a negative (−) voltage is applied to the first layer 701 and a positive (+) voltage is applied to the second layer 702, the first layer 701 may expand, and the second layer 702 may contract. At this time, the display 220 may be deformed to be convex toward the front surface of the electronic device 200 (e.g., in an upper direction in the drawing).

In another example, referring to FIG. 7B, in a case where a positive (+) voltage is applied to the first layer 701 and a negative (−) voltage is applied to the second layer 702, the first layer 701 may contract, and the second layer 702 may expand. At this time, the display 220 may be deformed to be convex toward the rear surface of the electronic device 200 (e.g., in a lower direction in the drawing). The contraction and expansion of the display 220 may generate sound waves.

Meanwhile, referring to FIG. 7C, the coil 254 may generate a magnetic field M as an electrical signal (e.g., an electric current) is applied thereto. The magnetic field M may be generated in the shape of concentric circles around a wire (e.g., a coil portion (e.g., the coil portion B1 of FIG. 6A) of a second wire (e.g., the second wire B of FIGS. 6A and 6B)). The magnetic field M may be generated to pass through the piezo unit 700. The magnetic field M may vibrate a permanent magnet and a vibration plate included in a hearing aid device. Accordingly, the coil 254 may provide a sound to a hearing-impaired person.

Figure 8:
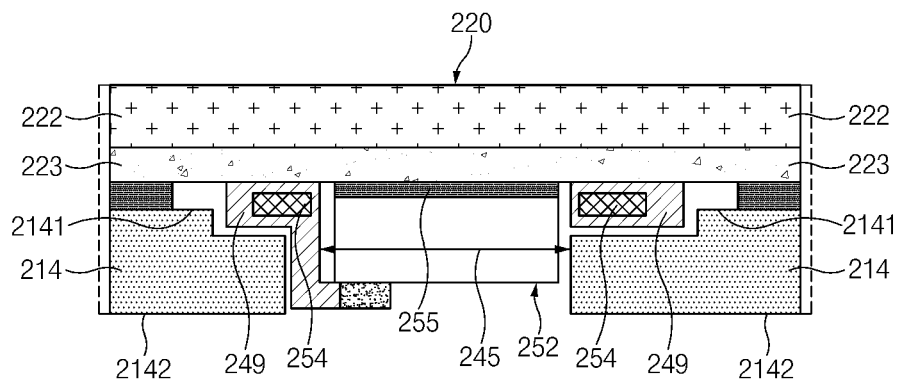
FIG. 8 is a sectional view of a speaker module of an electronic device according to an embodiment of the disclosure.

FIG. 8 is a sectional view of a speaker module of an electronic device according to an embodiment of the disclosure.

Referring to FIG. 8, the electronic device 200 may include the plate structure 214, the display 220, a flexible printed circuit board 249, the piezo unit 252, and the coil 254. The plate structure 214 may include the first surface 2141 facing the layer group 223 of the display 220 and the second surface 2142 facing a printed circuit board (e.g., the printed circuit board 230 of FIGS. 4A and 4B). The first surface 2141 may face the front surface of the electronic device 200, and the second surface 2142 may face the rear surface of the electronic device 200. In some embodiments of the disclosure, the plate structure 214 may be referred to as a component of the housing (e.g., the first support member 142 of FIG. 3). For example, the electronic device 200 may include a bracket (e.g., the side member 140 of FIG. 3) that includes the plate structure 214, the display 220, and a housing including a back cover (e.g., the second cover 180 of FIG. 3).

In the illustrated embodiment of the disclosure, the display 220 may include the display panel 222 and the layer group 223 stacked on the display panel 222. The layer group 223 may include the shielding layer for blocking noise generated from electric elements included in the display 220 and the cushion layer for protecting the display 220 from external shock. The shielding layer may include, for example, a metal layer containing a metallic material, or a graphite sheet. The cushion layer may include, for example, an EMBO layer having an embossing pattern formed thereon.

In the illustrated embodiment of the disclosure, the flexible printed circuit board 249 may include the coil 254. In this case, the flexible printed circuit board 249 may be part of a connecting member (e.g., the connecting member 240 of FIG. 5) that is connected to the display 220, or may be a separate member.

In the illustrated embodiment of the disclosure, the coil 254 may be disposed around the piezo unit 252. The coil 254 may be formed by a conductive pattern (e.g., the coil portion B1 of the second wire B of FIG. 6A) that is included in the flexible printed circuit board 249.

In the illustrated embodiment of the disclosure, the piezo unit 252 may be attached to the layer group 223 of the display 220. The piezo unit 252 may be connected with the flexible printed circuit board 249. The piezo unit 252 may be disposed such that at least part of the piezo unit 252 is surrounded by the coil 254.

In the illustrated embodiment of the disclosure, the piezo unit 252 may include a plurality of ceramic layers (e.g., the first layer 701 and the second layer 702 of FIGS. 7A to 7C), and expansion and contraction of the ceramic layers may vibrate the display 220 to convert an electrical signal into a sound signal. For example, the display 220 may function as a vibration plate. The ceramic layers included in the piezo unit 252 may function as a capacitor in that voltages of opposite polarities are applied to the ceramic layers, and therefore the piezo unit 252 may not generate a separate magnetic field.

A speaker module including only the piezo unit 252 may not generate a magnetic field and therefore may not meet the Hearing Aid Compatibility (HAC) standards.

The electronic device 200 according to the embodiments of the disclosure may further include the coil 254 in addition to the piezo unit 252 and may thus generate a magnetic field that meets the HAC standards. Furthermore, in the electronic device 200, the coil 254 may be formed in part (e.g., the second area 242 of FIG. 5) of the connecting member (e.g., the connecting member 240 of FIG. 5) that connects the display 220 and the printed circuit board (e.g., the printed circuit board 230 of FIGS. 4A and 4B), and the piezo unit 252 may be disposed in the space 245 surrounded by the coil 254. Accordingly, the interior space of the electronic device 200 may be efficiently used.

Figure 9A:
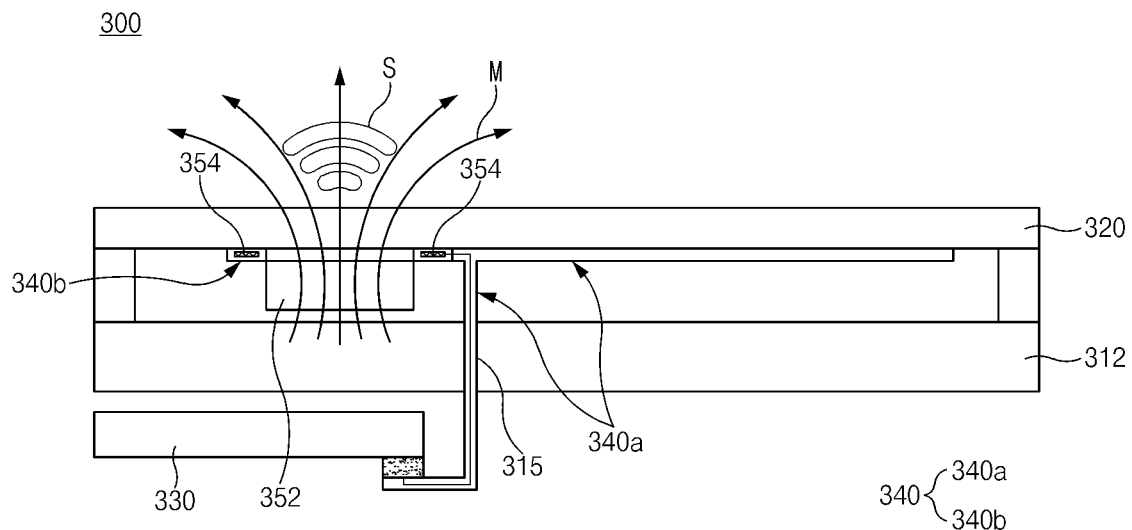
FIGS. 9A and 9B are sectional views of an electronic device according to various embodiments of the disclosure.
Figure 9B:
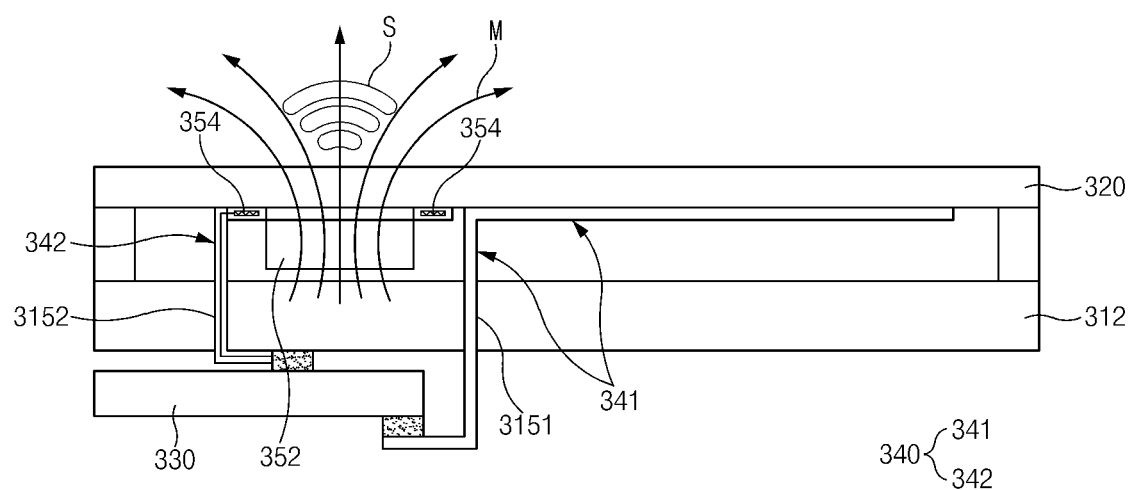

FIGS. 9A and 9B are sectional views of an electronic device according to various embodiments of the disclosure.

Referring to FIGS. 9A and 9B, in the illustrated embodiment of the disclosure, the electronic device 300 may include a bracket 312, a display 320, a printed circuit board 330, a flexible printed circuit board (FPCB) 340, a piezo unit 352, and a coil 354. The flexible printed circuit board 340 may be referred to as the connecting member illustrated in FIGS. 4A, 4B, 5, 6A, 6B, 7A to 7C, and 8.

In the illustrated embodiment of the disclosure, the bracket 312 may include a frame structure (e.g., the frame structure 213 of FIG. 5) that forms surfaces (e.g., side surfaces) of the electronic device 300 and a plate structure (e.g., the plate structure 214 of FIG. 5) that extends from the frame structure into the electronic device 300. One or more openings 315 through which the flexible printed circuit board 340 passes may be formed in the plate structure of the bracket 312.

In various embodiments of the disclosure, the printed circuit board 330 may include a processor (e.g., the processor 232 of FIGS. 4A and 4B) that is configured to control the piezo unit 352 and the coil 354. The printed circuit board 330 may be connected with the display 320 and the piezo unit 352 by the flexible printed circuit board 340. The processor may transmit and receive signals with the display 320, the coil 354, and the piezo unit 352 through wires (e.g., the first wire A, the second wire B, and the third wire C of FIGS. 6A and 6B) that are included in the flexible printed circuit board 340.

In the illustrated embodiment of the disclosure, the coil 354 may be disposed around the piezo unit 352. The piezo unit 352 may be attached to a rear surface of the display 320 to vibrate the display 320 based on an electrical signal received from the processor. The piezo unit 352 may be connected to the wires included in the flexible printed circuit board 340.

In the illustrated embodiment of the disclosure, the coil 354 may be formed to surround at least part of the piezo unit 352. The coil 354 may be formed on the flexible printed circuit board 340 by a wire (e.g., the coil portion B1 of the second wire B of FIG. 6A) that is included in the flexible printed circuit board 340. The coil 354 and the piezo unit 352 may be electrically connected with the processor (not illustrated) that is included in the printed circuit board 330.

Referring to FIG. 9A, the flexible printed circuit board 340 may include a first area 340a that connects the display 320 and the printed circuit board 330 and a second area 340b that extends from the first area 340a to the piezo unit 352. The first area 340a may extend to the printed circuit board 330 through the openings 315, and the second area 340b may be disposed between the display 320 and the bracket 312.

In the illustrated embodiment of the disclosure, the second area 340b may include a wire (e.g., the second wire B of FIGS. 6A and 6B) that electrically connects the coil 354 and the processor (not illustrated), in which at least part of the wire forms the coil 354 surrounding the piezo unit 352.

Referring to FIG. 9B, the flexible printed circuit board 340 may include a first flexible printed circuit board 341 that connects the display 320 and the printed circuit board 330 and the second flexible printed circuit board 342 on which the coil 354 is formed and that connects the piezo unit 352 and the printed circuit board 330. The coil 354 may be formed to surround at least part of the piezo unit 352. The first flexible printed circuit board 341 may extend to pass through a first opening 3151 formed in the bracket 312. The second flexible printed circuit board 342 may extend to pass through the second opening 3152 formed in the bracket 312.

In the illustrated embodiment of the disclosure, the second flexible printed circuit board 342 may include a wire (e.g., the second wire B of FIGS. 6A and 6B) that electrically connects the coil 354 and the processor, in which at least part of the wire forms the coil 354.

Figure 10:
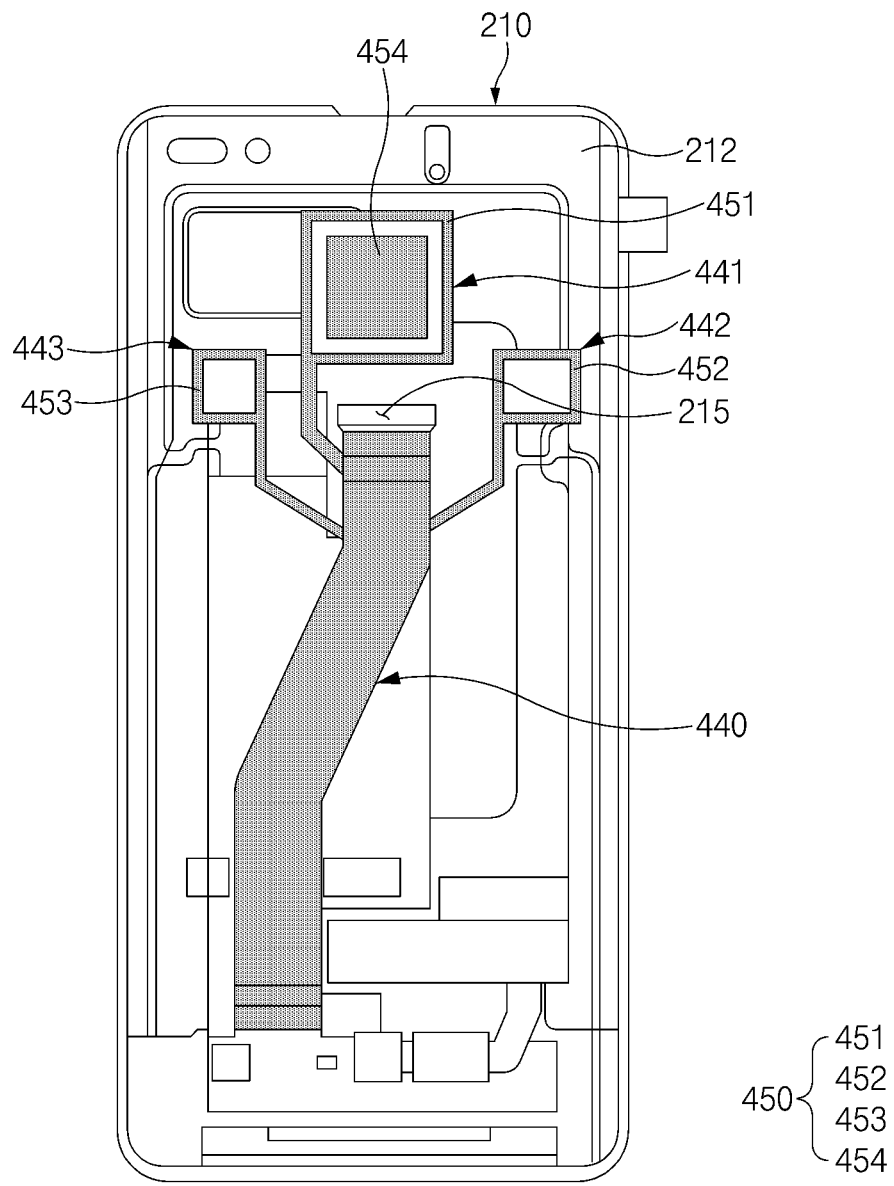
FIG. 10 is a view illustrating a speaker module of an electronic device according to an embodiment of the disclosure.

FIG. 10 is a view illustrating a speaker module of an electronic device according to an embodiment of the disclosure.

Referring to FIG. 10, the speaker module 450 for HAC (hereinafter, referred to as the speaker module) may include coils 451, 452, and 453 formed in extension areas 441, 442, and 443 extending from a connecting member 440 and a piezo unit 454 disposed adjacent to at least one of the coils 451, 452, and 453.

In the illustrated embodiment of the disclosure, the extension areas 441, 442, and 443 may include the first extension area 441 (e.g., the second area 242 of FIG. 5) in which the first coil 451 (e.g., the coil 254 of FIG. 5) is formed and that is connected with the piezo unit 454, the second extension area 442 in which the second coil 452 is formed, and the third extension area 443 in which the third coil 453 is formed.

In the illustrated embodiment of the disclosure, the coils 451, 452, and 453 may be connected with a processor (e.g., the processor 232 of FIGS. 4A and 4B) through wires (e.g., the first wire A, the second wire B, and the third wire C of FIGS. 6A and 6B) that are formed in the connecting member 440 and the extension areas 441, 442, and 443. The coils 451, 452, and 453 may generate magnetic fields based on electrical signals transmitted from the processor. The coils 451, 452, and 453 may include the first coil 451 that surrounds at least part of the piezo unit 454 and that is formed in the first extension area 441, the second coil 452 formed in the second extension area 442, and the third coil 453 formed in the third extension area 443. The first coil 451, the second coil 452, and the third coil 453 may be disposed in different areas when a bracket 212 is viewed from above.

In various embodiments of the disclosure, the piezo unit 454 may vibrate a display (e.g., the display 220 of FIGS. 4A and 4B) based on an electrical signal. Accordingly, the piezo unit 454 may convert the electric signal into a sound.

In various embodiments of the disclosure, the coils 451, 452, and 453 may generate magnetic fields (e.g., the magnetic field M of FIGS. 9A and 9B) based on electrical signals. The magnetic fields may vibrate a permanent magnet and a vibration plate. The permanent magnet and the vibration plate may be included in the electronic device, or may be included in a hearing aid device (e.g., a hearing aid).

The electronic device according to the embodiments of the disclosure may provide a hearing aid mode to a user. The hearing aid mode may include a mode in which magnetic fields are generated through the coils 451, 452, and 453. The processor (e.g., the processor 232 of FIGS. 4A and 4B) may be configured to apply, to the coils 451, 452, and 453, electrical signals including information related to a sound desired to be output, when the user selects the hearing aid mode. Accordingly, the coils 451, 452, and 453 may generate magnetic fields corresponding to the sound output through the piezo unit 454, and the magnetic fields may vibrate a permanent magnet of a hearing aid device worn by the user (e.g., a hearing-impaired person), thereby providing the sound to the user.

Figure 11:
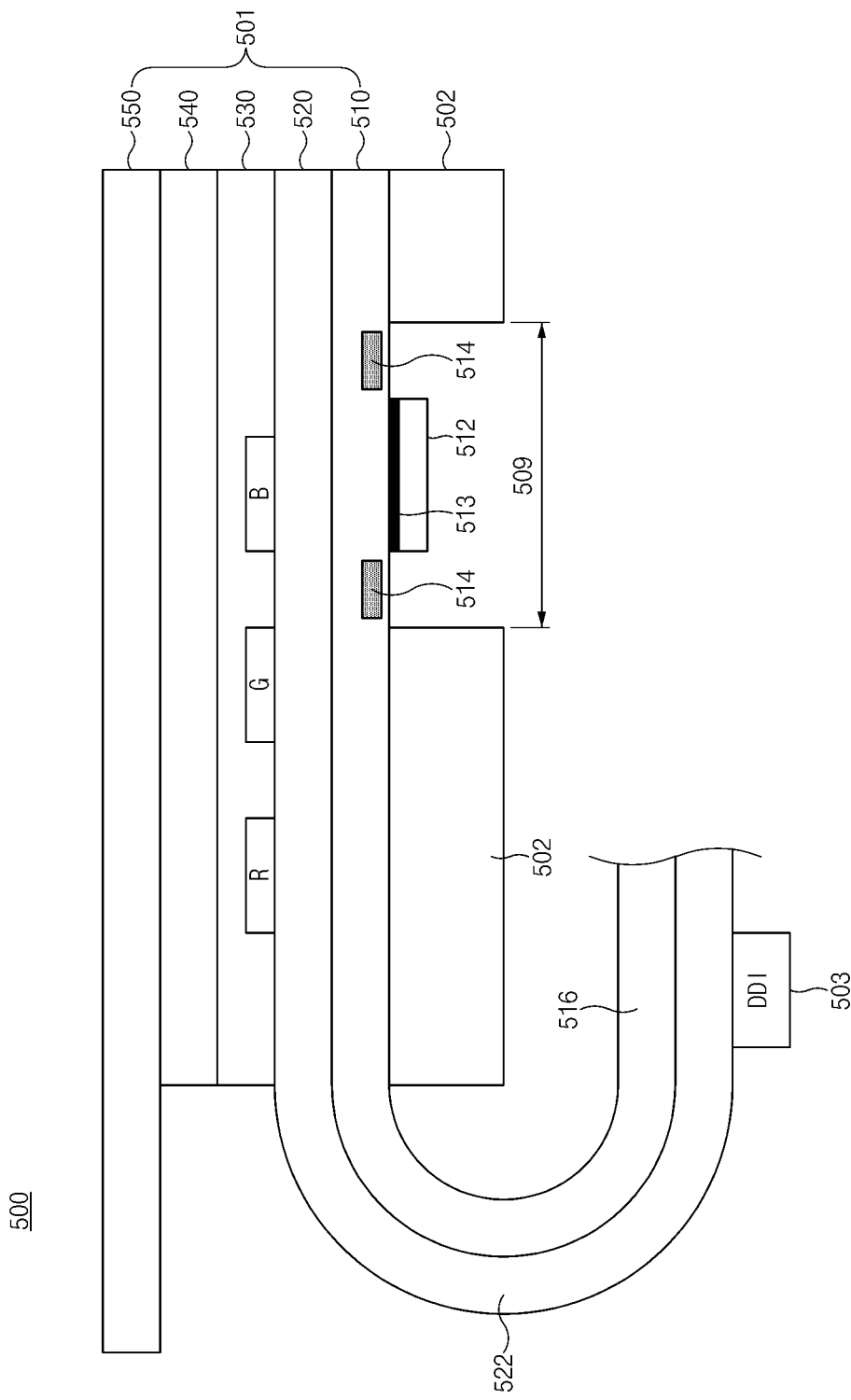
FIG. 11 is a view illustrating a display including a speaker module according to an embodiment of the disclosure.

FIG. 11 is a view illustrating a display including a speaker module according to an embodiment of the disclosure.

Referring to FIG. 11, the display 500 (e.g., the display 220 of FIGS. 4A and 4B) may include a display panel 501 (e.g., the display panel 222 of FIGS. 4A and 4B), a layer group 502 (e.g., the layer group 223 of FIGS. 4A and 4B), and a display driver IC 503 (e.g., the display driver IC 225 of FIGS. 4A and 4B).

In the illustrated embodiment of the disclosure, the display panel 501 may include a substrate 510, a thin film transistor (TFT) layer 520, a light emitting layer 530, a thin film encapsulation (TFE) layer 540, and a cover 550. In various embodiments of the disclosure, the display 500 may not include some of the components illustrated in the drawing, or may further include non-illustrated components (e.g., a touch sensor layer and a polarizer).

In the illustrated embodiment of the disclosure, the cover 550 may be formed to be transparent to allow light generated from the light emitting layer 530 to pass through the cover 550. In some embodiments of the disclosure, the cover 550 may be referred to as a component of a housing (e.g., the first cover 120 of FIG. 3). The thin film transistor layer 520 may be disposed on the substrate 510. The thin film transistor layer 520 may include a plurality of transistors printed on a film. The transistors may be electrically connected with light emitting elements R, G, and B included in the light emitting layer 530. The light emitting layer 530 may include the plurality of light emitting elements R, G, and B. The light emitting elements R, G, and B may include OLED elements. The thin film encapsulation layer 540 may be formed to encapsulate the light emitting layer 530 so as to prevent the light emitting elements R, G, and B from being exposed to moisture or air. In various embodiments of the disclosure, the layer group 502 may include at least one of a light blocking layer (e.g., a black layer), a cushion layer, and a shielding layer. The layer group 502 may have an opening 509 formed therein. A piezo unit 512 may be disposed in the opening 509.

In various embodiments of the disclosure, the display driver IC (DDI) 503 may be disposed on a first extension layer 522 (e.g., the extension layer 224 of FIGS. 4A and 4B) that extends from a part of the layers included in the display panel 501. For example, the first extension layer 522 may extend from the thin film transistor layer 520.

In the illustrated embodiment of the disclosure, the thin film transistor layer 520 may be disposed on a first surface of the substrate 510, and the layer group 502 may be disposed on a second surface of the substrate 510. The substrate 510 may be formed of a flexible material. For example, the substrate 510 may contain an insulating PI material. The substrate 510 may include a second extension layer 516 extending outside the display panel 501.

In various embodiments of the disclosure, a coil 514 that generates a magnetic field and a wire (not illustrated) that is connected with the coil 514 may be formed on the substrate 510. The coil 514 may be formed by a conductive pattern formed on the substrate 510. The conductive pattern may be formed by subjecting a conductive material to patterning on the substrate 510. The coil 514 may be formed around the piezo unit 512. The wire connected with the coil 514 may extend to a printed circuit board (e.g., the printed circuit board of FIGS. 4A and 4B) through the second extension layer 516 or the first extension layer 522.

In various embodiments of the disclosure, the piezo unit 512 may be attached to the substrate 510. The piezo unit 512 may be attached to a rear surface of the substrate 510. An adhesive layer 513 containing an adhesive material may be formed between the piezo unit 512 and the rear surface of the substrate 510. For example, the adhesive material may include a UV curable resin or a thermosetting resin. The piezo unit 512 may be disposed in the opening 509 formed in the layer group 502. The piezo unit 512 may be disposed such that at least part of the piezo unit 512 is surrounded by the coil 514.

In various embodiments of the disclosure, the piezo unit 512 may vibrate based on an electrical signal transmitted from a processor (e.g., the processor 232 of FIGS. 4A and 4B). The piezo unit 512 may vibrate the display 500. The vibration may generate sound waves. Accordingly, the piezo unit 512 may convert the electric signal into a sound.

In various embodiments of the disclosure, the coil 514 may generate a magnetic field based on an electrical signal transmitted from the processor. The magnetic field generated by the coil 514 may vibrate a permanent magnet and a vibration plate connected to the permanent magnet, thereby generating a sound. The permanent magnet and the vibration plate that interact with the magnetic field may be included in a hearing aid device (e.g., a hearing aid). The coil 514 may provide a predetermined magnetic field related to a sound to the hearing aid device, thereby providing the sound to a user that has the hearing aid device on. The magnetic field may be a magnetic field corresponding to a sound converted by the piezo unit 512.

An electronic device 200 according to embodiments of the disclosure may include a housing 210, a display 220 that is visually exposed through one surface of the housing 210 and that includes a display panel 222 including a pixel array and a layer group 223 including a plurality of layers stacked on the display panel 222, a printed circuit board 230 disposed in the housing 210, a piezo unit 252 attached to a rear surface of the display panel 222, and a flexible printed circuit board (FPCB) 249 that is connected to the piezo unit 252 and that extends to the printed circuit board 230, the flexible printed circuit board including a coil 254 that surrounds at least part of the piezo unit 252.

In various embodiments of the disclosure, the flexible printed circuit board 249 may include an opening area surrounded by the coil 254, and the piezo unit 252 may be disposed in the opening area such that a periphery of the piezo unit 252 is spaced apart from the coil 254 at a predetermined interval.

In various embodiments of the disclosure, the piezo unit 252 may be disposed such that part of the piezo unit 252 overlaps the coil 254 when the flexible printed circuit board 249 is viewed from above.

In various embodiments of the disclosure, the electronic device may further include a connecting member 240 including a first area 241 extending from the display panel 222 to the printed circuit board 230 and a second area 242 extending from the first area 241, and the second area 242 may include the flexible printed circuit board 249.

In various embodiments of the disclosure, the display 220 may further include an extension layer 224 extending from the display panel 222 and a display driver IC 225 disposed on the extension layer 224, the printed circuit board 230 may include a processor 232, and the first area 241 of the connecting member 240 may extend from the extension layer to the printed circuit board 230 such that the processor 232 and the display driver IC 255 are electrically connected with each other.

In various embodiments of the disclosure, the second area 242 may include a coil area 243 in which the coil 254 is formed and an opening area 245 surrounded by the coil area 243, and at least part of the piezo unit 252 may be disposed in the opening area 245.

In various embodiments of the disclosure, the connecting member 240 may further include a third area extending from the first area 241 and/or the second area 2421 and a second coil 254 formed in the third area.

In various embodiments of the disclosure, the electronic device may further include a processor 232 that controls the piezo unit 252 and the coil 254, the processor 232 may be disposed on the printed circuit board 230, and the piezo unit 252 may be electrically connected with the processor 232 through the flexible printed circuit board 249.

In various embodiments of the disclosure, the display 220 may further include an extension layer 224 extending from the display panel 222 and a display driver IC 225 disposed on the extension layer 224. The connecting member 240 may further include a first wire A that electrically connects the piezo unit 252 and the processor 232, a second wire B that electrically connects the coil 254 and the processor 232, and a third wire C that electrically connects the processor 232 and the display driver IC 225. The third wire C may be formed in the first area 241, and the first wire A and the second wire B may be formed in the second area 242 and may extend to the printed circuit board 230 via the first area 241.

In various embodiments of the disclosure, the second wire B may include a coil area 243 that forms the coil and a line area 244 that extends from the coil area 243 to the printed circuit board 230.

In various embodiments of the disclosure, the piezo unit 252 may include a terminal 253, and the first wire A may electrically connect the terminal 253 and the processor 232.

In various embodiments of the disclosure, the electronic device may further include a connecting member 240 including a first area 241 extending from the display 220 to the printed circuit board 230 and a second area 242 extending from the first area 241, and the second area 242 may include the flexible printed circuit board 249. The housing 210 may include a first cover 120 through which the display 220 is visually exposed, a second cover 180 opposite to the first cover 120, and a bracket 212 including a frame structure 213 that surrounds a space between the first cover 120 and the second cover 180 and a plate structure 214 that extends from the frame structure 213 to between the first cover 120 and the second cover 180. The piezo unit 252 and the coil 254 may be disposed between the plate structure 214 and the display 220, and the printed circuit board 230 may be disposed between the plate structure 214 and the second cover 180.

In various embodiments of the disclosure, an opening 315 may be formed in the plate structure 214, the first area 241 of the connecting member 240 may have a first end portion connected to the display panel 222 and a second end portion extending to the printed circuit board 230 through the opening 315, and the second area 242 may extend from any area between the first end portion and the second end portion of the first area 241.

In various embodiments of the disclosure, the electronic device may further include a processor that provides a hearing aid mode to a user, and the processor may be configured to apply an electrical signal to the coil 254 when the user selects the hearing aid mode.

An electronic device 200 according to embodiments of the disclosure may include a first cover 120 that forms a front surface of the electronic device 200, a second cover 180 opposite to the first cover 120, a bracket 212 including a frame structure 213 that connects peripheries of the first cover 120 and the second cover 180 and a plate structure 214 that extends from the frame structure 213 to a space between the first cover 120 and the second cover 180, a display 220 disposed between the plate structure 214 and the first cover 120 so as to be visually exposed through the first cover, a printed circuit board 230 disposed between the plate structure 214 and the second cover 180, a connecting member 240 extending from the display 220 to the printed circuit board 230 and including a coil 254 formed on a portion thereof, and a speaker module including a piezo unit 252. The piezo unit 252 may be attached to a rear surface of the display 220, may be connected with the connecting member 240, and may be disposed such that at least part of the piezo unit 252 is surrounded by the coil 254.

In various embodiments of the disclosure, the speaker module 250 may include one or more second coils 254 formed in another area of the connecting member 240.

In various embodiments of the disclosure, the electronic device 200 may further include a processor configured to control a hearing aid mode and the speaker module, and the processor may be configured to apply an electrical signal to the coil 254 through the connecting member 240 in the hearing aid mode.

In various embodiments of the disclosure, the display 220 may include a display driver IC 225 disposed on the connecting member 240.

In various embodiments of the disclosure, an opening 315 may be formed in the plate structure 214 of the bracket 212, and the connecting member 240 may extend to the printed circuit board 230 through the opening 315.

The electronic devices according to the embodiments of the disclosure may provide Hearing Aid Compatibility (HAC) performance. Furthermore, the piezo speaker module and the coil may be integrated with each other, and thus the internal mounting space of each of the electronic devices may be efficiently used. Moreover, the speaker module may lower a defect rate of the electronic device. In addition, the disclosure may provide various effects that are directly or indirectly recognized.

Various embodiments of the disclosure and terms used herein are not intended to limit the technologies described in the disclosure to specific embodiments of the disclosure, and it should be understood that the embodiments and the terms include modification, equivalent, and/or alternative on the corresponding embodiments described herein. With regard to description of drawings, similar components may be marked by similar reference numerals. The terms of a singular form may include plural forms unless otherwise specified. In the disclosure disclosed herein, the expressions "A or B", "at least one of A and/or B", "A, B, or C", or "at least one of A, B, and/or C", and the like used herein may include any and all combinations of one or more of the associated listed items. Expressions, such as "first," or "second," and the like, may express their components regardless of their priority or importance and may be used to distinguish one component from another component but is not limited to these components. When an (e.g., first) component is referred to as being "(operatively or communicatively) coupled with/to" or "connected to" another (e.g., second) component, it may be directly coupled with/to or connected to the other component or an intervening component (e.g., a third component) may be present.

According to the situation, the expression "adapted to or configured to" used herein may be interchangeably used as, for example, the expression "suitable for", "having the capacity to", "changed to", "made to", "capable of" or "designed to" in hardware or software. The expression "a device configured to" may mean that the device is "capable of" operating together with another device or other parts. For example, a "processor configured to (or set to) perform A, B, and C" may mean a dedicated processor (e.g., an embedded processor) for performing corresponding operations or a generic-purpose processor (e.g., a central processing unit (CPU) or an application processor (AP)) which performs corresponding operations by executing one or more software programs which are stored in a memory device (e.g., the memory).

The term "module" used herein may include a unit, which is implemented with hardware, software, or firmware, and may be interchangeably used with the terms "logic", "logical block", "part", "circuit", or the like. The "module" may be a minimum unit of an integrated part or a part thereof or may be a minimum unit for performing one or more functions or a part thereof. The "module" may be implemented mechanically or electronically and may include, for example, an application-specific IC (ASIC) chip, a field-programmable gate array (FPGA), and a programmable-logic device for performing some operations, which are known or will be developed.

At least a part of an apparatus (e.g., modules or functions thereof) or a method (e.g., operations) according to various embodiments may be, for example, implemented by instructions stored in a computer-readable storage media (e.g., the memory) in the form of a program module. The instruction, when executed by a processor (e.g., the processor), may cause the processor to perform a function corresponding to the instruction. The computer-readable recording medium may include a hard disk, a floppy disk, a magnetic media (e.g., a magnetic tape), an optical media (e.g., a compact disc read only memory (CD-ROM) and a digital versatile disc (DVD), a magneto-optical media (e.g., a floptical disk)), an embedded memory, and the like. The one or more instructions may contain a code made by a compiler or a code executable by an interpreter.

Each component (e.g., a module or a program module) according to various embodiments of the disclosure may include single entity or a plurality of entities, a part of the above-described sub-components may be omitted, or other sub-components may be further included. Alternatively or additionally, after being integrated in one entity, some components (e.g., a module or a program module) may identically or similarly perform the function executed by each corresponding component before integration. According to various embodiments of the disclosure, operations executed by modules, program modules, or other components may be executed by a successive method, a parallel method, a repeated method, or a heuristic method, or at least one part of operations may be executed in different sequences or omitted. Alternatively, other operations may be added.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
a housing;
a display visually exposed through one surface of the housing, the display including a display panel having a pixel array and a layer group, the layer group including a plurality of layers stacked on the display panel;
a printed circuit board disposed in the housing;
a piezo circuit attached to a rear surface of the display panel; and
a connecting member including a first area extending from the display panel to the printed circuit board and a second area extending from the first area and connected to the piezo circuit,
wherein the second area of the connecting member includes a flexible printed circuit board (FPCB) including a coil surrounding at least part of the piezo circuit.

2. The electronic device of claim 1,
wherein the FPCB further includes an opening area surrounded by the coil, and
wherein the piezo circuit is disposed in the opening area such that a periphery of the piezo circuit is spaced apart from the coil at a predetermined interval.

3. The electronic device of claim 1, wherein a part of the piezo circuit overlaps the coil when the FPCB is viewed from above.

4. The electronic device of claim 1,
wherein the display further includes an extension layer and a display driver integrated circuit (IC), the extension layer extending from the display panel, the display driver IC being disposed on the extension layer,
wherein the printed circuit board includes a processor, and
wherein the first area of the connecting member extends from the extension layer to the printed circuit board such that the processor and the display driver IC are electrically connected with each other.

5. The electronic device of claim 1,
wherein the second area includes a coil area in which the coil is formed and an opening area surrounded by the coil area, and
wherein part of the piezo circuit is disposed in the opening area.

6. The electronic device of claim 1, wherein the connecting member further includes a third area extending from at least one of the first area or the second area and a second coil formed in the third area.

7. The electronic device of claim 6, further comprising:
a speaker circuit including the second coil formed in the third area of the connecting member.

8. The electronic device of claim 1, further comprising:
a processor configured to control the piezo circuit and the coil,
wherein the processor is disposed on the printed circuit board, and
wherein the piezo circuit is electrically connected with the processor through the FPCB.

9. The electronic device of claim 8,
wherein the display further includes an extension layer and a display driver integrated circuit (IC), the extension layer extending from the display panel, the display driver IC being disposed on the extension layer,
wherein the connecting member further includes a first wire electrically connecting the piezo circuit and the processor, a second wire electrically connecting the coil and the processor, and a third wire electrically connecting the processor and the display driver IC, wherein the third wire is formed in the first area, and wherein the first wire and the second wire are formed in the second area and extend to the printed circuit board via the first area.

10. The electronic device of claim 9, wherein the second wire includes a coil area configured to form the coil and a line area extending from the coil area to the printed circuit board.

11. The electronic device of claim 1, wherein the housing includes a first cover through which the display is visually exposed, a second cover opposite to the first cover, and a bracket including a frame structure and a plate structure, the frame structure surrounding a space between the first cover and the second cover, the plate structure extending from the frame structure to a region between the first cover and the second cover, wherein the piezo circuit and the coil are disposed between the plate structure and the display, and wherein the printed circuit board is disposed between the plate structure and the second cover.

12. The electronic device of claim 11, wherein an opening is formed in the plate structure, wherein the first area of the connecting member has a first end portion connected to the display panel and a second end portion extending to the printed circuit board through the opening, and wherein the second area extends from any area between the first end portion and the second end portion of the first area.

13. The electronic device of claim 1, wherein part of the FPCB extends from between the piezo circuit and the printed circuit board to the display.

14. The electronic device of claim 13, further comprising: a speaker circuit including the piezo circuit.

15. The electronic device of claim 1, further comprising:
a processor configured to:
provide a hearing aid mode to a user, and
in response to the user selecting the hearing aid mode, apply an electrical signal to the coil.

16. The electronic device of claim 1, further comprising:
a processor configured to control the piezo circuit and the coil,
wherein the display further includes a display driver integrated circuit (IC), and wherein the connecting member further includes a first wire electrically connecting the piezo circuit and the processor, a second wire electrically connecting the coil and the processor, and a third wire electrically connecting the processor and the display driver IC.

17. An electronic device comprising:
a first cover forming a front surface of the electronic device;
a second cover opposite to the first cover;
a bracket including a frame structure and a plate structure, the frame structure connecting peripheries of the first cover and the second cover, the plate structure extending from the frame structure to a space between the first cover and the second cover;
a display including a display panel having a layer group, the layer group including a plurality of layers stacked on the display panel, the display being disposed between the plate structure and the first cover and being visually exposed through the first cover;
a printed circuit board disposed between the plate structure and the second cover;
a connecting member extending from the display to the printed circuit board and including a coil formed on a portion thereof; and
a speaker circuit including a piezo circuit,
wherein the piezo circuit is attached to a rear surface of the display through an opening formed in the plurality of layers and is connected with the connecting member, and
wherein at least part of the piezo circuit is surrounded by the coil.

18. The electronic device of claim 17, wherein the speaker circuit includes one or more second coils formed in an area of the connecting member.

19. The electronic device of claim 17, wherein the electronic device further comprises:
a processor configured to:
control a hearing aid mode and the speaker circuit, and
apply an electrical signal to the coil through the connecting member in the hearing aid mode.

20. The electronic device of claim 17,
wherein an opening is formed in the plate structure of the bracket, and
wherein the connecting member extends to the printed circuit board through the opening.

* * * * *